(12) United States Patent
Choi et al.

(10) Patent No.: US 8,475,980 B2
(45) Date of Patent: Jul. 2, 2013

(54) METHODS OF FORMING SEMICONDUCTOR DEVICES USING PHOTOLITHOGRAPHIC SHOT GROUPING

(75) Inventors: Jin Choi, Seoul (KR); Byung-gook Kim, Seoul (KR); Hee-bom Kim, Hwaseong-si (KR); Sang-hee Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 83 days.

(21) Appl. No.: 13/219,579

(22) Filed: Aug. 26, 2011

(65) Prior Publication Data

US 2012/0058432 A1    Mar. 8, 2012

(30) Foreign Application Priority Data

Sep. 7, 2010    (KR) .................. 10-2010-0087667

(51) Int. Cl.
*G03C 5/00*    (2006.01)
*G03F 9/00*    (2006.01)

(52) U.S. Cl.
USPC ............... 430/30; 430/5; 430/296; 430/328; 430/394; 430/942

(58) Field of Classification Search
USPC ................... 430/5, 30, 296, 942, 328, 394
See application file for complete search history.

(56) References Cited

U.S. PATENT DOCUMENTS 7,901,850 B2 *    3/2011    Fujimura et al. ............. 430/5
2010/0058279 A1    3/2010    Fujimura et al.

FOREIGN PATENT DOCUMENTS

JP    2008-066441    3/2008
KR    1019990024798 A    4/1999

* cited by examiner

*Primary Examiner* — Christopher Young
(74) *Attorney, Agent, or Firm* — Myers Bigel Sibley & Sajovec

(57) ABSTRACT

A method of forming a semiconductor device can include determining a shot set including a plurality of shots, based on a final pattern used to form a mask. Shots included in the plurality shots can be classified as being in a first pass shot set or in a second pass shot set, where each can include a plurality of non-directly neighboring shots. A first pass exposure can be performed to radiate a reticle to provide the first pass shot set and a second pass exposure can be performed to radiate the reticle to provide the second pass shot set.

20 Claims, 13 Drawing Sheets

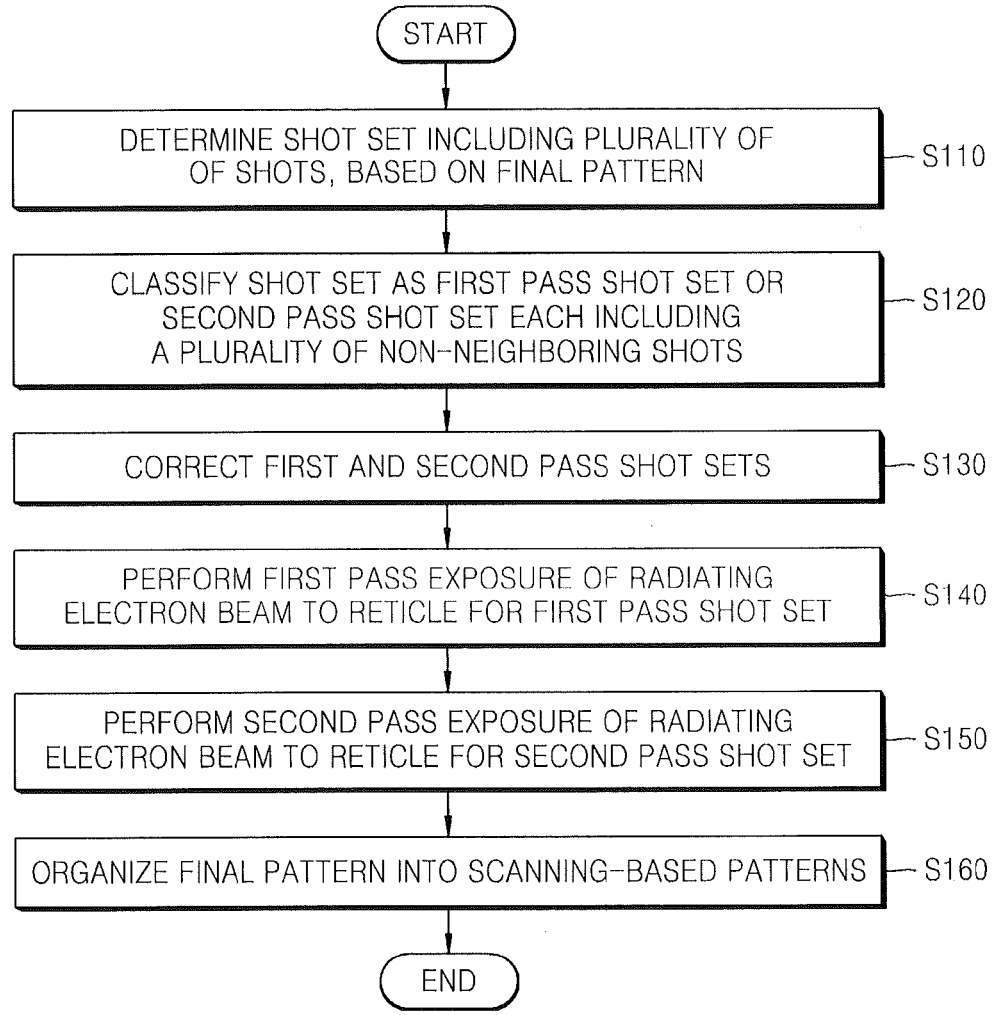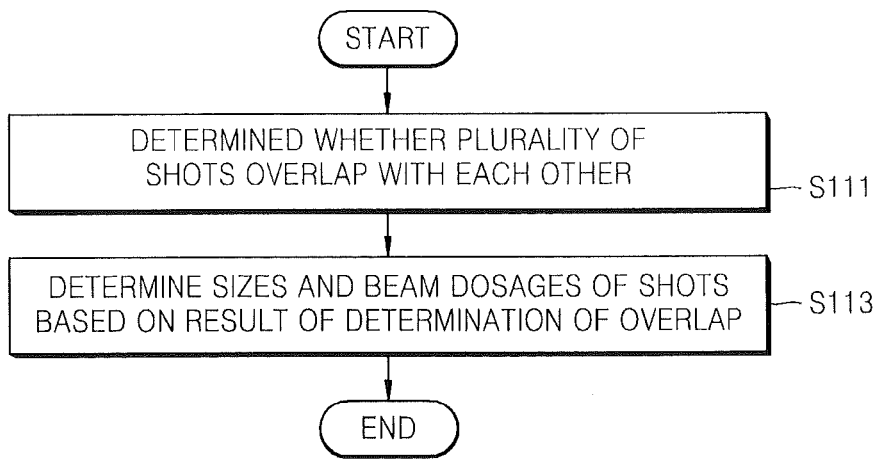

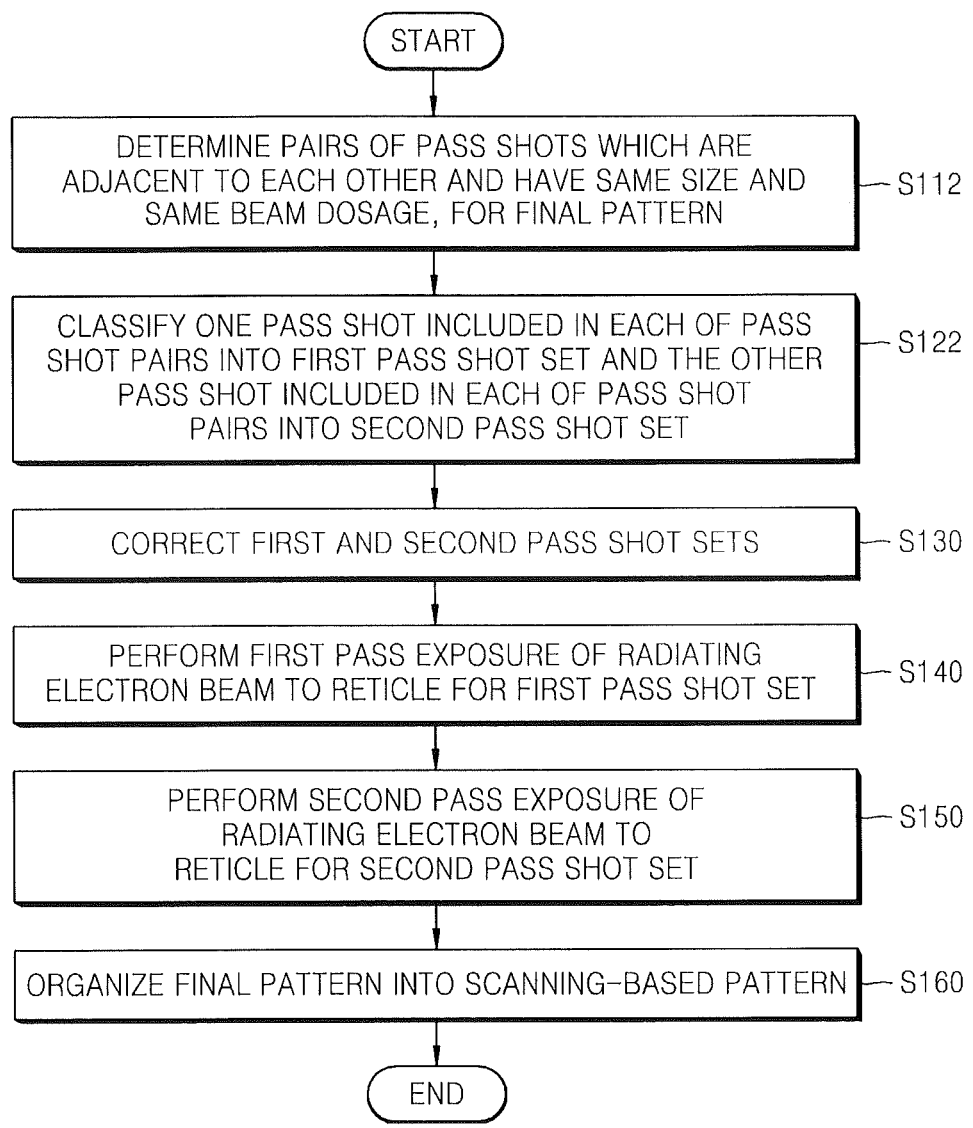

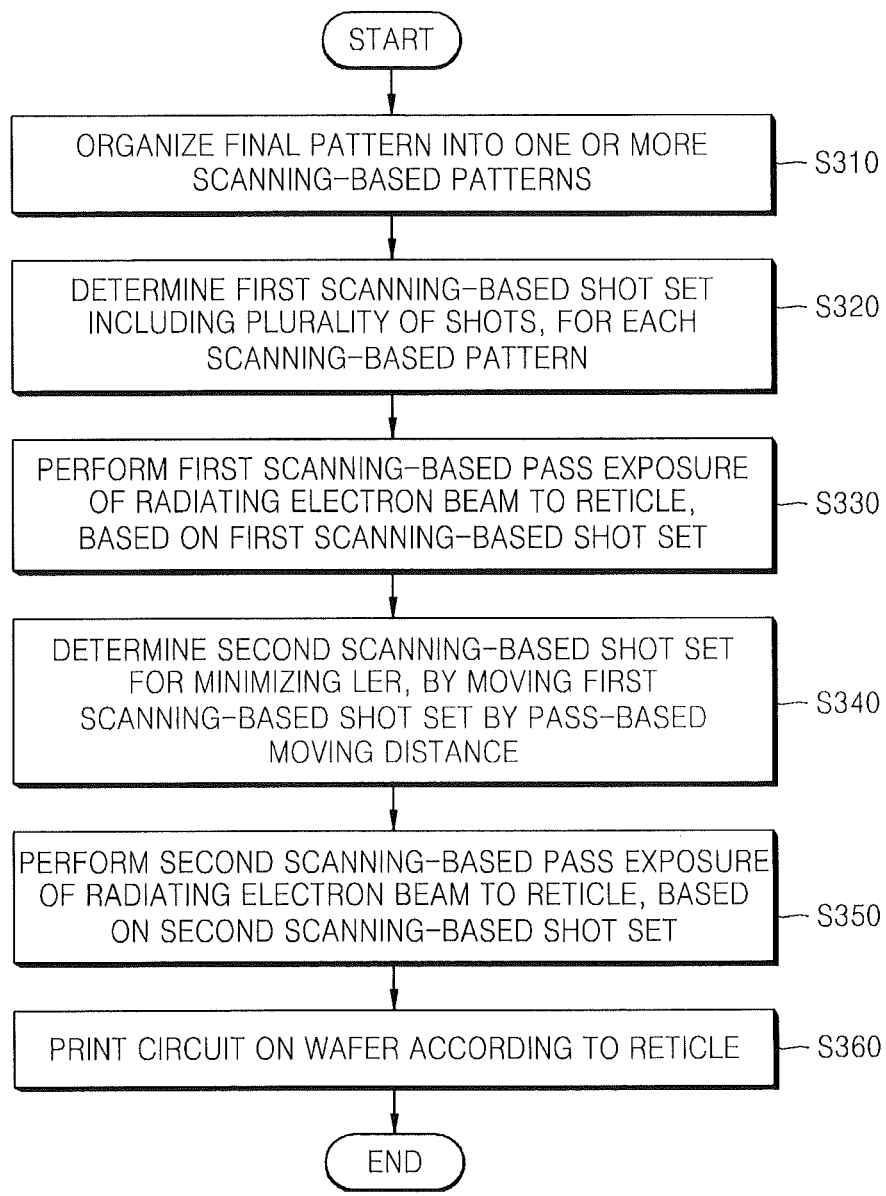

METHODS OF FORMING SEMICONDUCTOR DEVICES USING PHOTOLITHOGRAPHIC SHOT GROUPING

CROSS-REFERENCE TO RELATED APPLICATIONS

This application claims the benefit of Korean Patent Application No. 10-2010-0087667, filed on Sep. 7, 2010, in the Korean Intellectual Property Office, the disclosure of which is incorporated herein in its entirety by reference.

BACKGROUND

The inventive concept relates to field of electronics, and more particularly, to methods of forming semiconductor devices.

In the manufacture of semiconductor devices, a mask may be manufactured to form a specific circuit pattern. Masks may be manufactured using optical lithography using charged electron beams, X rays, or the like.

SUMMARY

The inventive concept provides a method of manufacturing semiconductor devices, by which an overall number of shots of a designed pattern may be reduced and also line edge roughness (LER) of the designed pattern may be reduced.

According to an aspect of the inventive concept, a method of manufacturing semiconductor devices can be provided by determining a shot set including a plurality of shots, based on a final pattern used to form a mask. Shots included in the plurality shots can be classified as being in a first pass shot set or in a second pass shot set, where each can include a plurality of non-directly neighboring shots. A first pass exposure can be performed to radiate a reticle to provide the first pass shot set and a second pass exposure can be performed to radiate the reticle to provide the second pass shot set.

In some embodiments according to the inventive concept, the shot set can be determined by determining whether any of the plurality of shots overlap one another to provide overlapping shots and determining at least one selected from the group consisting of size and beam dosage of the overlapping shots.

In some embodiments according to the inventive concept, the shot set can be determined by determining pairs of pass shots that are direct neighbors of each other and have substantially equal sizes and substantially equal beam dosages.

According to an aspect of the inventive concept, a method of manufacturing semiconductor devices can be provided by organizing a final pattern used to form a mask, into at least one pass-based pattern, based on an inclination of the final pattern. Pairs of pass-based shots that are direct neighbors to each other and have substantially equal sizes and substantially equal beam dosages can be determined to provide pass-based shot pairs for the pass-based pattern. The pass-based shot pairs can be classified into a first pass shot set or a second pass shot set. A first pass exposure of radiating an electron beam can be performed to a reticle for the first pass shot set and a second pass exposure of radiating the electron beam to the reticle can be performed for the second pass shot set.

In some embodiments according to the inventive concept, the first and second pass exposures perform on the pass-based pattern. In some embodiments according to the inventive concept, determining the pass-based shot pairs can be provided by determining the pass-based shot pairs, based on the inclination of the final pattern, the sizes of the plurality of shots, predetermined line edge roughness (LER), and whether the plurality of shots overlap with each other.

In some embodiments according to the inventive concept, a method of forming a pattern in a semiconductor device can be provided by determining a shot set including a plurality of shots each having a respective size and beam dosages associated therewith for formation a mask and determining the respective size and beam dosages to be used for each of the plurality of shots based on the determined shot set to provide a final pattern.

In some embodiments according to the inventive concept, determining the respective size and beam dosages can be provided by setting the respective size of each of the plurality of shots to be equal to one another and setting the respective beam dosages of the plurality of shots to be equal to one another. Ones of the plurality of shots can be organized into either a first pass of shots or a second pass of shots based on the respective sizes and respective beam dosages. In some embodiments according to the inventive concept, organizing can be provided by organizing the ones of the plurality of shots based on an inclination of the final pattern. In some embodiments according to the inventive concept, organizing can be provided by organizing the ones of the plurality of shots so that distances that separate directly neighboring shots are equal.

In some embodiments according to the inventive concept, the method can further include performing a first pass exposure to a reticle using the first pass of shots. A time interval can be provided that is configured to reduce heat damage to the reticle and a second pass exposure can be performed to the reticle using the second pass of shots after expiration of the time interval.

BRIEF DESCRIPTION OF THE DRAWINGS

FIG. 1 is a flowchart illustrating methods of manufacturing semiconductor devices, according to some embodiments of the inventive concept.

FIG. 2 is a flowchart illustrating operations of determining a shot set, which is included in the flowchart of FIG. 1.

FIG. 5 is a flowchart illustrating methods of manufacturing semiconductor devices, according to some embodiments of the inventive concept.

FIGS. 14 and 15 are flowcharts illustrating methods of manufacturing semiconductor devices, according to some embodiments of the inventive concept.

DETAILED DESCRIPTION OF EMBODIMENTS ACCORDING TO THE INVENTIVE CONCEPT

Figure 3A:
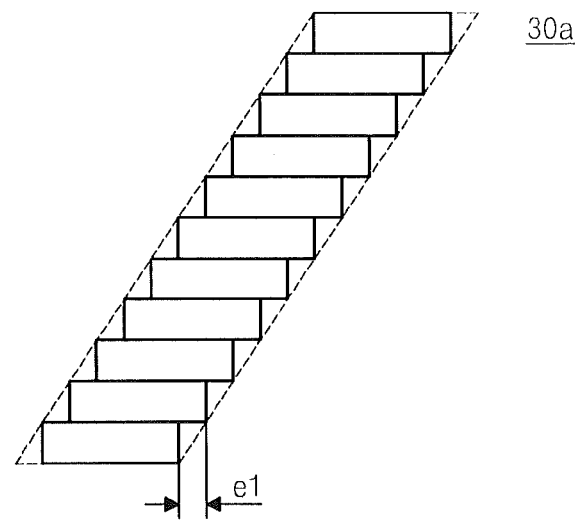
FIGS. 3A and 3B are diagrams illustrating determination of shot sets and line edge roughness (LER), according to an embodiment of the inventive concept.

The inventive concept will now be described more fully with reference to the accompanying drawings, in which exemplary embodiments of the inventive concept are shown. A same reference number is allocated to a same element for different embodiments. The same element may be representatively explained only in a first embodiment and omitted in subsequent embodiments.

This inventive concept may, however, be embodied in many different forms and should not be construed as being limited to the exemplary embodiments set forth herein. Rather, these embodiments are provided so that this disclosure will be thorough and complete, and will fully convey the scope of the inventive concept to those of ordinary skill in the art. In the drawings, lengths and sizes of layers and regions may be exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept. For example, a first element discussed below could be termed a second element, and similarly, a second element may be termed a first element without departing from the teachings of this disclosure.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other expressions describing relationships between elements, such as, "between" and "directly between" or "adjacent to" or "directly neighboring" or "direct neighbors" will also be similarly understood.

The terms used in the present specification are merely used to describe particular embodiments, and are not intended to limit the inventive concept. An expression used in the singular encompasses the expression of the plural, unless it has a clearly different meaning in the context. In the present specification, it is to be understood that the terms such as "including" or "having," etc., are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Embodiments of the inventive concept are described herein with reference to cross-sectional illustrations that are schematic illustrations of idealized embodiments (and intermediate structures) of the inventive concept. As such, variations from the shapes of the illustrations as a result, for example, of manufacturing techniques and/or tolerances, are to be expected. Thus, embodiments of the inventive concept should not be construed as being limited to the particular shapes of regions illustrated herein but are to include deviations in shapes that result, for example, from manufacturing.

In the specification, a shot denotes a radiation of an electron beam onto an object to be processed, such as, a reticle, to have a variable shape in order to form a pattern, and a pass denotes a series of operations of radiating an electron beam for at least one shot to form a pattern. A single pass or a plurality of passes may be performed to form a pattern. Over all of the plurality of passes, electron beams may be utilized to create identical shots or different shots.

FIG. 1 is a flowchart of a method of manufacturing semiconductor devices, according to some embodiments of the inventive concept.

Referring to FIG. 1, a shot set including a plurality of shots may be determined based on a final pattern used to manufacture semiconductor devices, in operation S110. The final pattern may correspond to a pattern desired to be formed on a silicon wafer or on a surface desired to be patterned. The final pattern may be formed based on the plurality of shots, and the shot set may be a collection of the plurality of shots.

In operation S120, the determined shot set may be classified as a first pass shot set or a second pass shot set each including a plurality of non-neighboring shots. Neighboring shots included in the determined shot set may not be included in the same shot set, and a plurality of non-neighboring shots may be included in the first pass shot set or the second pass shot set. For example, neighboring shots included in the determined shot set may be in different pass shot sets (i.e., one shot in the first pass shot set and the other is in the second pass shot set). A method of determining the first and second pass shot sets may vary according to embodiments. However, the separation two neighboring shots into the first and second pass shot sets is only an example, and thus a plurality of shots may be alternately included in a plurality of pass shot sets.

In some embodiments according to the inventive concept, the final pattern may be generated into a first auxiliary final pattern and a second auxiliary final pattern and provided. The first auxiliary final pattern and the second auxiliary final pattern may have shapes obtained by different movements of the final pattern. The first pass shot set may be determined based on the first auxiliary final pattern, and the second pass shot set may be determined based on the second auxiliary final pattern.

In operation S130, the first and second pass shot sets may be corrected. A plurality of shots included in the pass shot sets may be corrected by at least one selected from the group consisting proximity effect correction (PEC), optical proximity correction (OPC), and blur correction.

In operation S140, a first pass exposure of the electron beam to a reticle for the first pass shot set may be performed. The electrical beam may be radiated from an electron beam source including charged particles, and the electron beam may include X rays, extreme ultraviolet (EUV) beams, or the like.

In operation S150, a second pass exposure of radiating an electron beam to the reticle for the second pass shot set may be performed, after the electron beam is radiated for the first pass shot set. Time interval may exist between the first pass exposure and the second pass exposure. Since each of the first and second pass shot sets may include non-neighboring shots, a time interval may exist when neighboring shots are radiated. In other words, the separation of the shots used for neighboring shots into different passes, means that the neighboring shots will be done at different times in some embodiments according to the inventive concept.

If electron beams are used to radiate neighboring first and second pass shot sets without the time interval therebetween, the reticle may be exposed to excessive radiation which may cause heat damaged to the reticle. In addition, a proximity effect may occur between neighboring shots that occur simultaneously.

Although FIG. 1 is based on the first and second pass shot sets, a plurality of pass shot sets may be determined for the final pattern, and a plurality of pass exposure operations may be performed.

In operation S160, the final pattern may be organized into scanning-based patterns. The scanning-based patterns are formed by dividing the final pattern into regions where scanning is performed, regardless of the first and second pass shot sets. For example, if the final pattern is organized into first and second scanning-based patterns, the above-described operations, such as determination of shot sets for the first scanning-based pattern, determination of the first and second pass shot sets according to the shot sets, and the first and second pass exposure operations, may be performed. In this way, pattern formation on the reticle with respect to the first scanning-based pattern may be completed.

After the pattern formation on the reticle with respect to the first scanning-based pattern is completed, the same operations are repeated for the second scanning-based pattern. Thus, pattern formation with respect to the second scanning-based pattern may be completed, so that the final pattern may be formed. On the other hand, when the final pattern is determined as a single scanning-based pattern, the above-described operations are performed with respect to the entire final pattern, so that the final pattern may be formed.

In some embodiments according to the inventive concept, the operation S160 of dividing the final pattern into the scanning-based patterns may be followed by the operation S110 of determining the shot set including the plurality of shots by considering the scanning-based patterns as the final pattern. After the operation S110 of determining the shot set including the plurality of shots on the basis of the final pattern, subsequent operations such as an operation of dividing the final pattern into scanning-based patterns and determining the first and second pass shot sets with respect to shot sets included in the scanning-based patterns may be performed. In some embodiments according to the inventive concept, after the operation S130 of correcting the first and second pass shot sets, the final pattern may be organized into scanning-based patterns, and then operations S140 and S150 of performing the first pass exposure and the second pass exposure, respectively, with respect to the scanning-based patterns may be performed.

Accordingly, in some embodiments according to the inventive concept, the shot set can be determined whereupon the size of the shots and the dosage for those shots can be determined in response to the determination of the shots included in the shot set.

FIG. 2 is a flowchart of the operation S110 of FIG. 1, according to an embodiment of the inventive concept.

Referring to FIG. 2, to determine a shot set, it may be determined whether some of the plurality of shots overlap with each other, in operation S111. If it is determined that the plurality of shots do not overlap with each other, the sizes of shots used to form the final pattern may decrease, and the overall number of shots may increase. On the other hand, if it is determined that the plurality of shots overlap with each other, the sizes of the shots used to form the final pattern may increase, and the overall number of shots may decrease. However, correction of regions where the shots are overlapped may be additionally required.

In operation S113, at least one of the group consisting of the sizes and beam dosages of the shots may be determined based on the result of the determination. The sizes and beam dosages of the shots to be included in shot sets may vary according to whether the shots are overlapped with each other. For example, if the plurality of shots overlap with each other, electron beams are repeatedly emitted to the overlapping region between the shots, and thus the sizes of the shots may be distorted or the reticle may be damaged by heat. Accordingly, shot sets may be determined differently according to whether the shots overlap with each other.

Figure 3B:
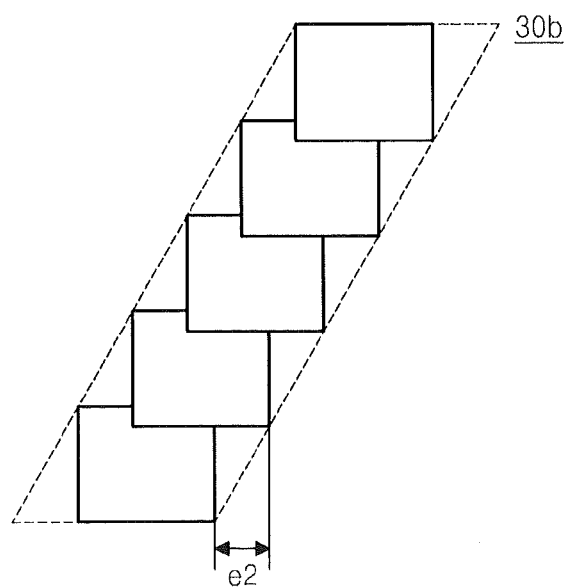

FIGS. 3A and 3B are diagrams for explaining determination of shot sets and line edge roughness (LER), according to an embodiment of the inventive concept.

Referring to FIG. 3A, a non-overlapping shot set 30a may include a plurality of shots. Referring to FIG. 3B, an overlapping shot set 30b may also include a plurality of shots. The overlapping shot set 30b has fewer (but larger) shots than those in the non-overlapping shot set 30a.

The LER denotes roughness when a final pattern has an inclined shape and includes a plurality of shots. The roughness of an inclined pattern may be represented as an error between neighboring shots. In the present specification, the error and the LER have substantially the same meaning. As the error increases, the LER may increase. As the error decreases, the LER may decrease.

A first error e1 of the non-overlapping shot set 30a is less than a second error e2 of the overlapping shot set 30b. Accordingly, the non-overlapping shot set 30a has a small error (LER) even when including many shots. As the inclination of the final pattern with respect to an x-axis and a y-axis increases, the LER may also increase with the enlargement of the shot.

In FIGS. 3A and 3B, after each of the shots included in each of the shot sets 30a and 30b undergoes one pass exposure, additional pass exposures may be performed on shots in the same position several times. In this case, due to the radiation of electron beams impinging at the same location, the time used to form a mask may increase regardless of the accuracy of the final pattern. Moreover, when pass exposure is performed on the same location, a beam dosage large enough to satisfy a critical dimension for forming the final pattern should be organized according to the number of pass exposures performed, due to the heating effect.

However, in the semiconductor device manufacturing method according to some embodiments of the inventive concept, the time used to form the mask may be reduced by radiating electron beams during different pass exposures by spacing neighboring shots of the final patterns 30a and 30b apart from each other at time intervals, so that the heating effect may be reduced.

Figure 4A:
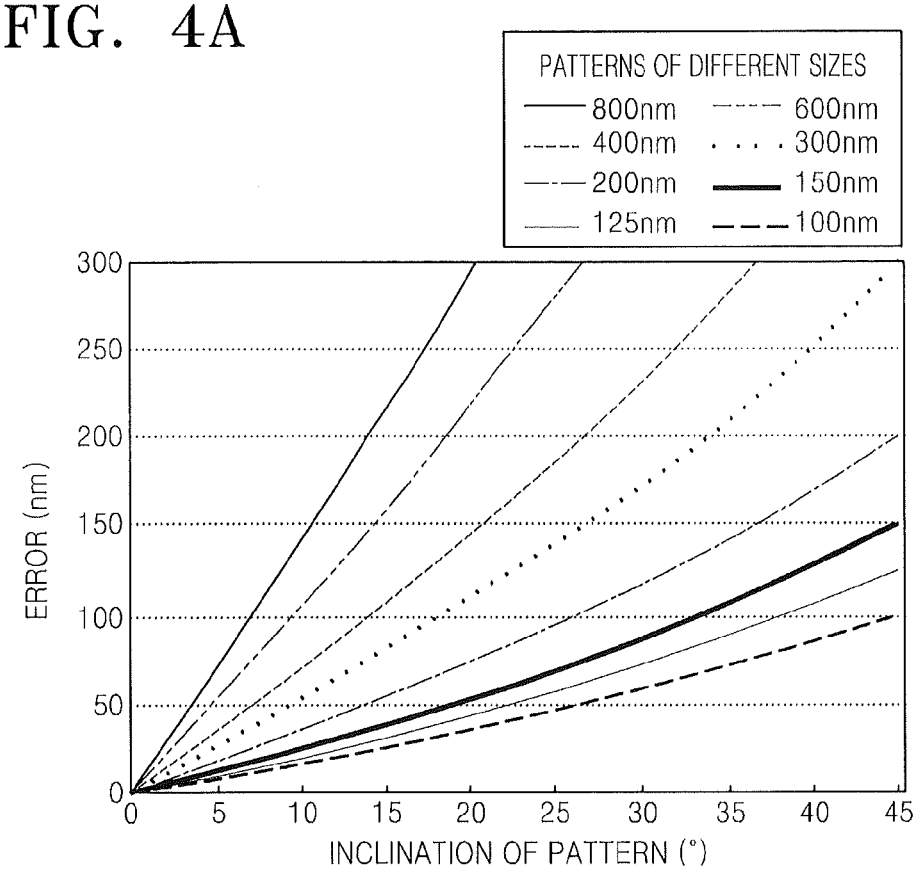
FIG. 4A is a graph showing relationships between pattern inclination and an error to explain the LER.

FIG. 4A is a graph showing a relationship between a pattern inclination and an error between neighboring patterns in order to explain the LER.

Figure 4B:
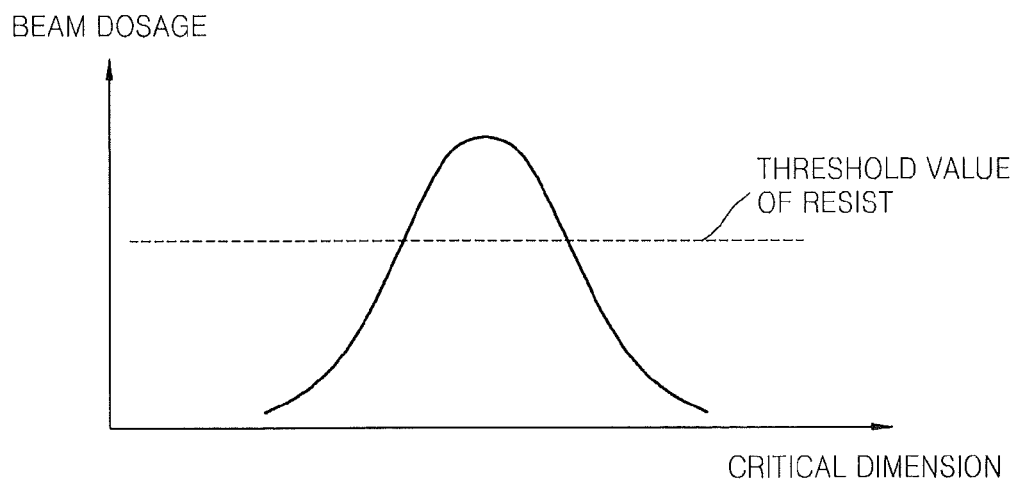
FIG. 4B is a graph showing relationships between beam dosage of a shot and a critical dimension of the shot, according to an embodiment of the inventive concept.

In FIG. 4A, the x axis indicates the pattern inclination, and the y axis indicates the error between neighboring patterns. In FIGS. 4A and 4B, different sizes of patterns have different errors according to pattern inclinations.

Referring to FIG. 4A, the error increases as the pattern inclination increases, regardless of the sizes of the patterns. The errors may also be greater with larger patterns.

When the sizes of shots increase, the number of shots used to form the same final pattern decreases, and thus the time required to form the final pattern may be reduced. However, larger shot size may cause the error to increase, and thus the final pattern may not be formed as accurately.

When a plurality of overlapping shots are used to simply form a final pattern, further LER reduction may be sought.

FIG. 4B is a graph showing a relationship between a beam dosage of a shot and a critical dimension of the shot, according to an embodiment of the inventive concept. In FIG. 4B, the x axis indicates the critical dimension of the shot, and the y axis indicates the beam dosage of the shot. Since FIG. 4B is to show a relationship between the beam dosage and the critical dimension, the units of the beam dosage and the critical dimension are omitted.

Referring to FIG. 4B, an electron beam is distributed with a Gaussian distribution symmetrical about the center of an electron beam radiated for a single shot. Charged electrons may be represented as a beam dosage. The critical dimension of a pattern formed on the reticle by the shot may vary according to a threshold value of resist coated on the reticle.

The resist may be a material sensitive to electron beams, and when the beam dosage is greater than the threshold value of the resist, a region exposed to a beam dosage that exceeds the threshold value of the resist may be formed as a pattern. Accordingly, the beam dosage and the shape of a pattern formed on the pattern may be related to each other.

A photomask may be formed based on the exposed reticle. The reticle may function as the photomask and undergo processes such as etching, ion implantation, oxidization, and polishing to form an independent layer.

In other words, a surface on which the final pattern is desired to be formed may be exposed to light by using the photomask, thereby forming a pattern. In some embodiments according to the inventive concept, a semiconductor device may be manufactured using a maskless direct write method. In the maskless direct write method, a layer may be patterned by particle-type beam lithography without forming a photomask.

A semiconductor device manufacturing method according to the inventive concept may use a variable shaped beam (VSB).

Figure 6:
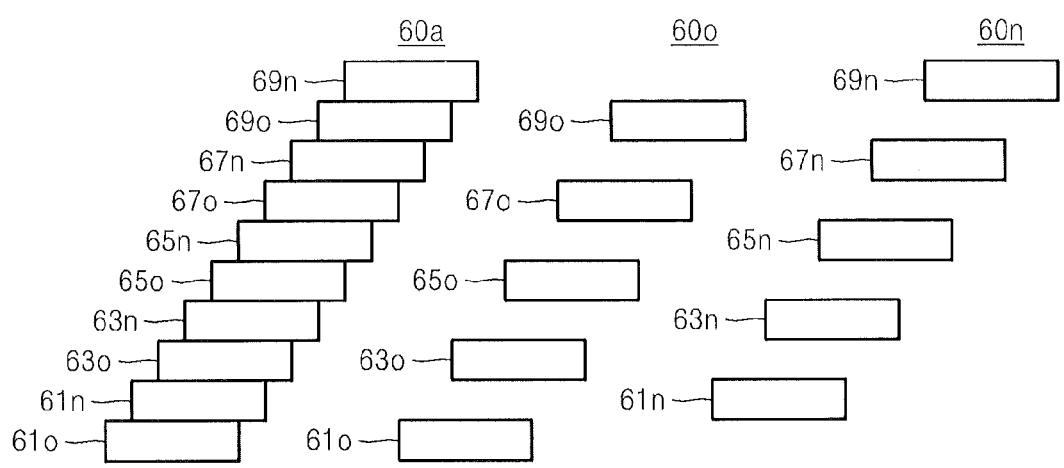
FIG. 6 is a diagram illustrating methods of manufacturing semiconductor devices.

FIG. 5 is a flowchart of a semiconductor device manufacturing method according to some embodiments of the inventive concept. FIG. 6 is a diagram for explaining the semiconductor device manufacturing method of FIG. 5.

The semiconductor device manufacturing method according to some embodiments of the inventive concept will now be described with reference to FIGS. 5 and 6.

Referring to FIG. 5, pairs of pass shots which are adjacent to each other (i.e. direct neighbors) and have the same size and the same beam dosage may be determined for a final pattern, in operation S112. Each of the pass shot pairs may include two shots having the same sizes and the same beam dosages, but the positions of the two shots constituting each pass shot pair may be different. The positions of the shots may be determined based on a specific position of an object to be processed, such as a reticle, on which the final pattern is to be formed.

For example, if a plurality of shots are determined for the final pattern and pass exposure is performed twice on the shots, an electron beam may be radiated on the same shot twice. In some embodiments of the inventive concept, to avoid radiating the same location more than once in same shot, second pass exposure may be performed on each shot which is displaced, after first pass exposure is performed on the original position of each shot, in order to have substantially the same effect as that when an electron beam is radiated twice for the same shot.

For example, a plurality of shots $61o$, $61n$, $63o$, $63n$, $65o$, $65n$, $67o$, $67n$, $69o$, and $69n$ may be determined to form a final pattern $60a$ of FIG. 6. Two adjacent shots from among a plurality of shots may constitute a pass shot pair. A first pair of pass shots 61o and $61n$, a second pair of pass shots $63o$ and $63n$, a third pair of pass shots $65o$ and $65n$, a fourth pair of pass shots $67o$ and $67n$, and a fifth pair of pass shots 69o and $69n$ may each have the same shot size and the same beam dosage.

In operation S122, one pass shot included in each of the pass shot pairs may be classified into a first pass shot set, and the other pass shot included in each of the pass shot pairs may be classified into a second pass shot set.

For example, a first pass shot set $60o$ may include respective one pass shots $61o$, $63o$, $65o$, $67o$, and 69o included in the first through fifth pass shot pairs, and a second pass shot set $60n$ may include the respective other pass shots $61n$, $63n$, $65n$, $67n$, and $69n$ included in the first through fifth pass shot pairs.

Although the first and second pass shot sets $60o$ and $60n$ each include pairs of adjacent pass shots, determination of pass shot sets according to the overall number of pass exposures performed to form the final pattern $60a$ is not limited thereto. In other words, three or more pass shot sets may be determined for neighboring shots.

In operation S130, the first and second pass shot sets may be corrected. The correction of pass shot sets may be performed based on at least one of selected from the group consisting of PEC, OPC, and blur correction, as described above. In some embodiments according to the inventive concept, the correction of the first and second pass shot sets may be performed in the operation S122 of initially determining shot sets for a plurality of shots.

In operation S140, a first pass exposure of radiating an electron beam to a reticle for the first pass shot set may be performed. In operation S150, a second pass exposure of radiating an electron beam to the reticle for the second pass shot set $60n$ may be performed, after the electron beam is radiated for the first pass shot set $60o$. Since a time interval between the first pass exposure and the second pass exposure may exist, the radiation of directly neighboring shots during the same pass may be avoided, and thus both a proximity effect and excessive heating may be reduced.

Accordingly, pass shot pairs can be set to have the same size and the dosage, which can be used to determine how the shots are to be grouped together.

Figure 7:
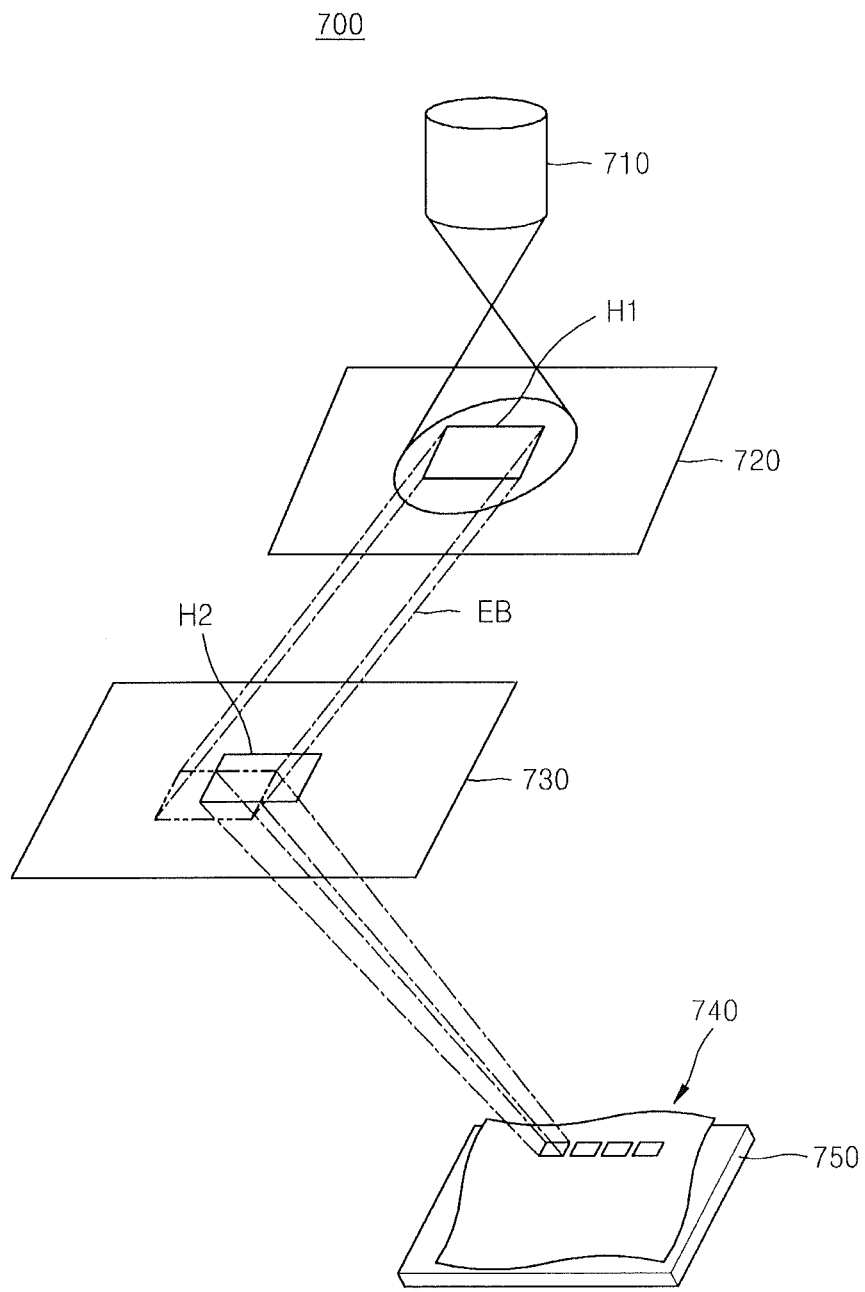
FIG. 7 illustrates an electron beam apparatus for performing a semiconductor device manufacturing method, according to an embodiment of the inventive concept.

FIG. 7 illustrates an electron beam apparatus 700 for performing a semiconductor device manufacturing method according to an embodiment of the inventive concept.

Referring to FIG. 7, the electron beam apparatus 700 may include an electron beam source 710, a first aperture 720, a second aperture 730, and a platform 750. The electron beam apparatus 700 may radiate an electron beam EB to a processing target 740.

The electron beam EB may include X rays, electron beams, ion beams, or EUV beams. The electron beam EB is radiated and passes through the first aperture 720 and the second aperture 730 and thus may have a shape that is different from the original shape. Then, the electron beam EB is applied to the processing target 740 to form a final pattern. Accordingly, an area of the processing target 740 that the electron beam EB reaches may be controlled by varying the positions of the first aperture 720 and the second aperture 730.

The first aperture 720 passes an electron beam EB received from the electron beam source 710 through a first hole H1, and the second aperture 730, which is below (i.e., downstream from) the first aperture 720, also passes, through a second hole H2, only a specific part of the electron beam EB passed through the first aperture H1. The electron beam EB is biased in a specific direction or the size thereof is changed, and then the electron beam EB reaches the processing target 740.

Examples of the processing target 740 may include a wafer, a photomask including a photoresist film, and a reticle. Accordingly, a specific shape may be drawn on the processing target 740 by the electron beam EB. However, the electron beam EB may be scattered due to a proximity effect and a blurring effect.

The platform 750 may move in a horizontal axis direction and a vertical axis direction so as to adjust the location of the processing target 740, thereby adjusting a location on the processing target 740 that the electron beam EB is to reach. However, since an error may occur during the movement of the platform 750, the error due to the movement of the platform 750 may be considered.

Figure 8:
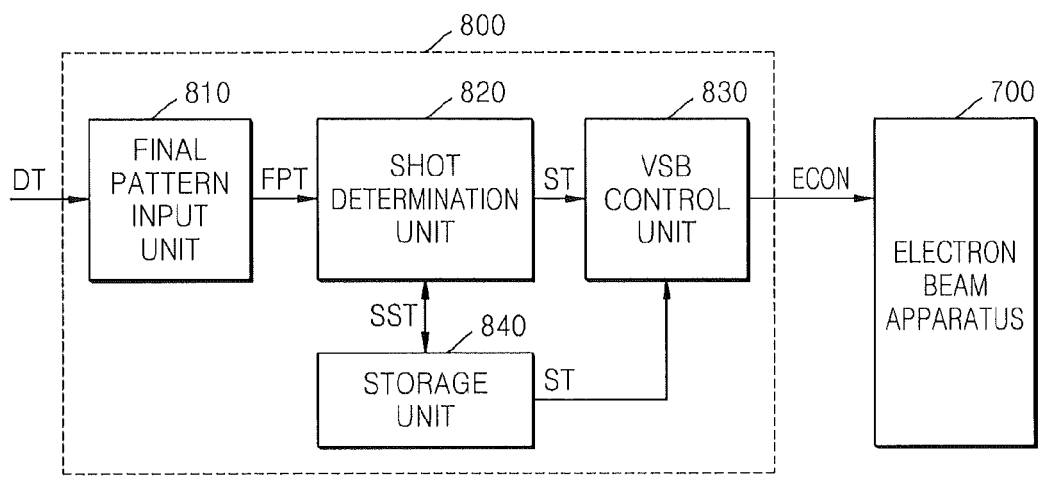
FIG. 8 illustrates a semiconductor device manufacturing apparatus for performing a semiconductor device manufacturing method, according to an embodiment of the inventive concept.

FIG. 8 is a block diagram of a semiconductor device manufacturing apparatus 800 for performing a semiconductor device manufacturing method according to an embodiment of the inventive concept.

Referring to FIG. 8, the semiconductor device manufacturing apparatus 800 may be electrically connected to the electron beam apparatus 700 so as to manufacture semiconductor devices.

The manufacturing apparatus controller 800 may include a final pattern input unit 810, a shot determination unit 820, and a variable-shaped beam (VSB) control unit 830.

The final pattern input unit 810 may receive a pattern signal DT from an external device such as a host, and provide a final pattern signal FPT to the shot determination unit 820. The final pattern input unit 810 may generate the final pattern signal FPT and a special database.

The shot determination unit 820 may generate a shot set signal ST, based on the final pattern signal FPT. The shot set signal ST may include information about the sizes and beam dosages of a plurality of shots for forming a final pattern according to the final pattern signal FPT, and may also include information such as a pass shot pair set or the like for the plurality of shots.

In some embodiments according to the inventive concept, the semiconductor device manufacturing apparatus 800 may further include a storage unit 840. The shot determination unit 820 may provide the shot set signal ST as a temporary shot set signal SST to the storage unit 840 to store the temporary shot set signal SST in the storage unit 840, and may receive the stored temporary shot set signal SST from the storage unit 840 to change the shot set signal ST.

The VSB control unit 830 may receive the shot set signal ST and generate a beam control signal ECON for controlling the electron beam apparatus 700. The beam control signal ECON may control the location of the first or second aperture 720 or 730 included in the electron beam apparatus 700 or may change the location of the platform 750, thereby changing a location on the processing target 740 that the electron beam EB reaches. The beam dosage of the electron beam EB provided from the electron beam source 710 may vary.

The VSB control unit 830 may receive the shot set signal ST from the storage unit 840 to generate the beam control signal ECON.

Figure 9:
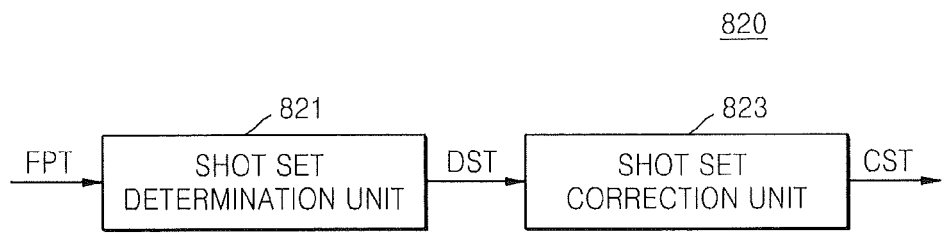
FIG. 9 is a block diagram of a shot determination unit of the semiconductor device manufacturing apparatus of FIG. 8.

FIG. 9 is a block diagram of the shot determination unit 820 of FIG. 8.

Referring to FIG. 9, the shot determination unit 820 may include a shot set determination unit 821 and a shot set correction unit 823.

The shot set determination unit 821 may determine a plurality of shots for forming the final pattern, based on the final pattern signal FPT. The plurality of shots may be determined to have different sizes and beam dosages according to whether the shots overlap with each other. In some embodiments according to the inventive concept, the plurality of shots may be determined based on predetermined LER.

In some embodiments according to the inventive concept, neighboring shots from among the plurality of shots may be determined to have substantially the same sizes and substantially the same beam dosages so that the neighboring shots constitute a pass shot pair.

The shot set correction unit 823 may receive a determination shot signal DST to generate a correction shot set signal CST. The correction shot set signal CST may be generated by performing correction, such as PEC or OPC, on the plurality of shots related to the determination shot signal DST. The correction shot set signal CST may be included in the shot set signal ST of FIG. 8.

Figure 10:
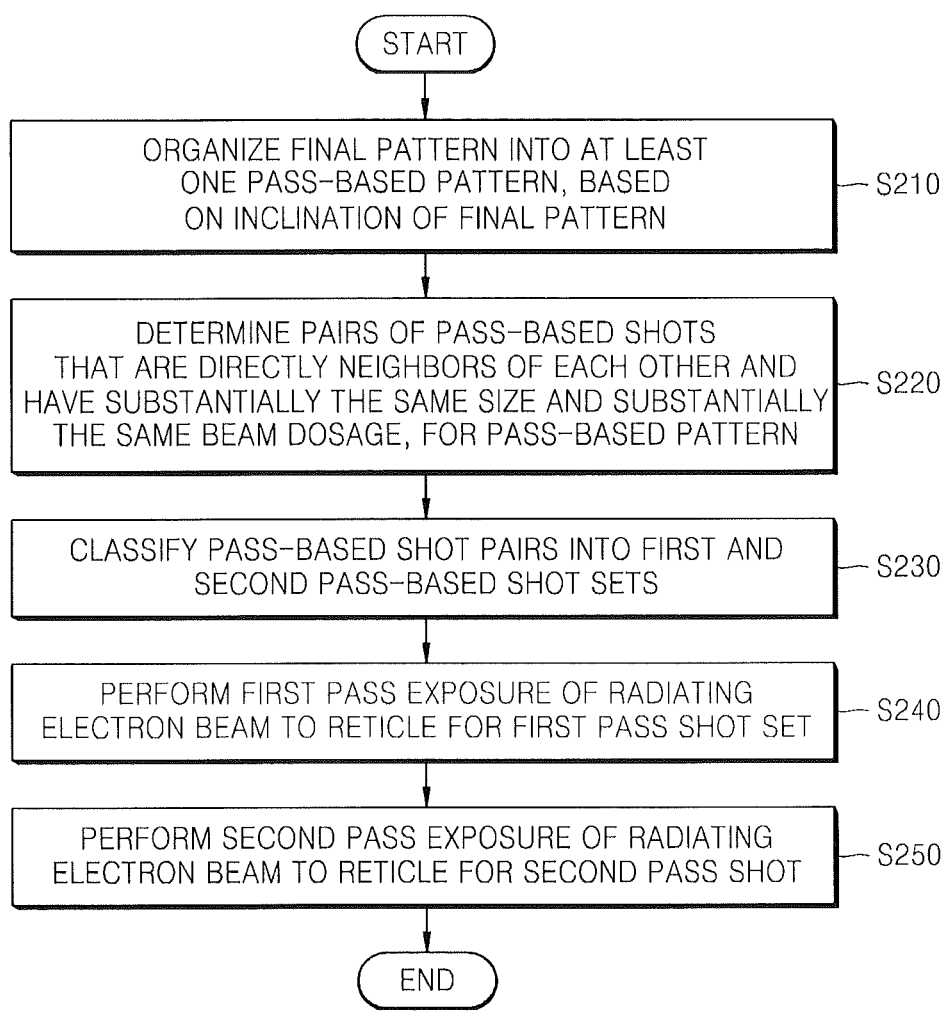
FIGS. 10 and 11 are flowcharts illustrating methods of manufacturing semiconductor devices, according to embodiments of the inventive concept.

FIG. 10 is a flowchart of a method of manufacturing semiconductor devices, according to some embodiments of the inventive concept.

Referring to FIG. 10, a final pattern may be organized into at least one pass-based pattern, based on the inclination of the final pattern, in operation S210. As described above, when a final pattern has an inclined shape, a relationship between LER and a shot size may vary according to the inclination of the final pattern. Since the positions of shots on which the first or second pass exposure is based may be changed according to the inclination of the final pattern, the sizes, beam dosages, and the like of the shots may be determined after final patterns having the same inclination are organized into a single pass-based pattern. The inclination of a final pattern may be determined with respect to the x axis and the y axis, based on a straight line contacting one boundary line of the final pattern.

In operation S220, pairs of pass-based shots that are adjacent to each other and have substantially the same size and substantially the same beam dosage may be determined for the pass-based pattern. In the pass-based pattern, the pass-based shots in each pair may be shots that are spaced a specific distance from each other in the inclination direction of the final pattern and have the same size and the same beam dosage. However, the distances for the pass-based shot pairs may be different.

In operation S230, the pass-based shot pairs may be classified into first and second pass-based shot sets. In a method similar to the semiconductor device manufacturing method of FIG. 5, one pass-based shot of each pass-based shot pair may be included in the first pass-based shot set, and the other pass-based shot of the pass-based shot pair may be included in the second pass-based shot set.

In operation S240, a first pass exposure of radiating an electron beam to a reticle for the first pass shot set may be performed.

In operation S250, a second pass exposure of radiating an electron beam to the reticle for the second pass shot set may be performed after the first pass exposure is performed. The first and second pass exposures may be performed on the pass-based pattern obtained by the division of the final pattern based on the inclination of the final pattern.

Figure 11:
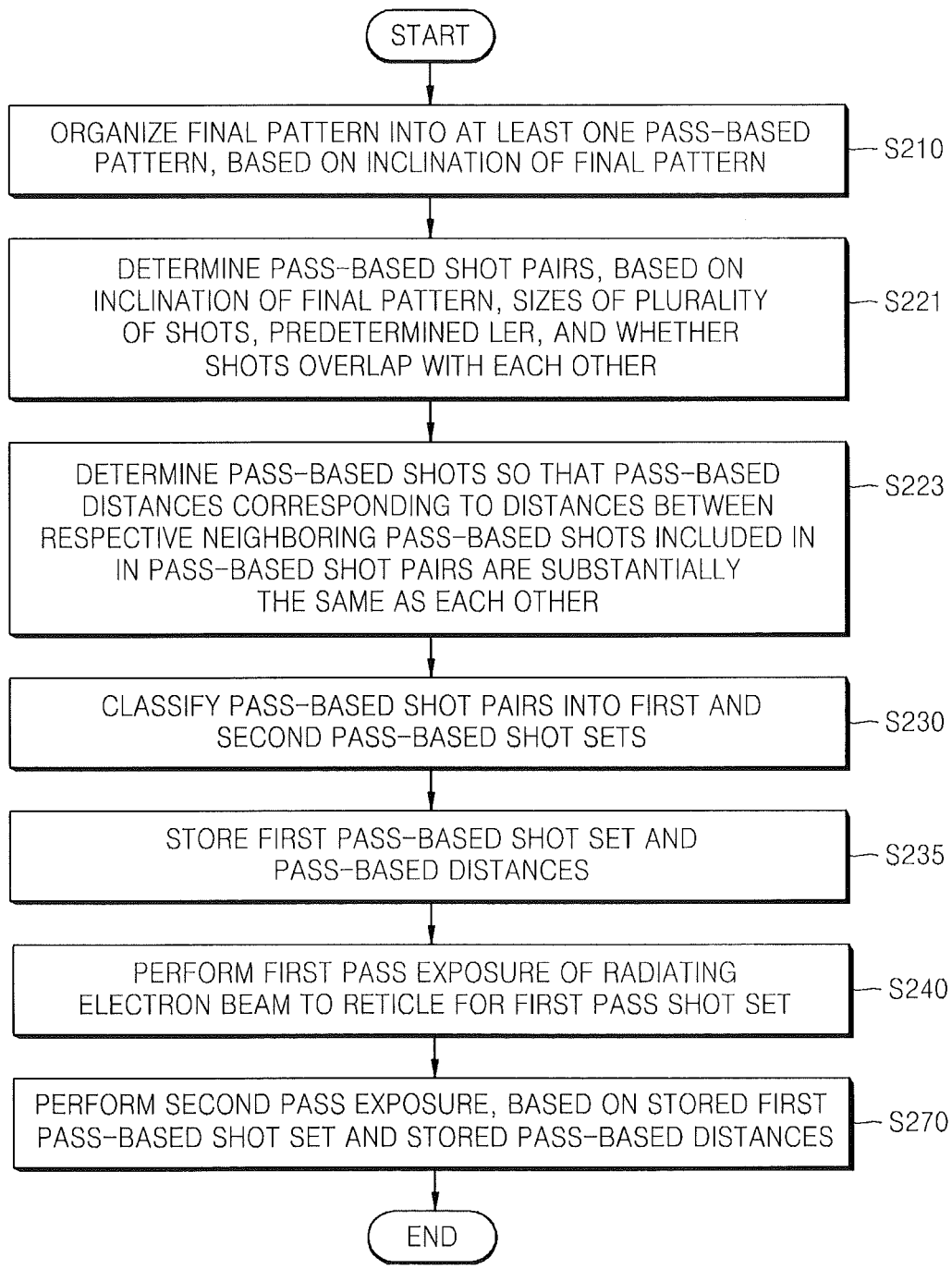

FIG. 11 is a flowchart of a semiconductor device manufacturing method, according to some embodiments of the inventive concept.

Referring to FIG. 11, a final pattern may be organized into at least one pass-based pattern, based on the inclination of the final pattern, in operation S210.

In operation S221, pass-based shot pairs may be determined based on the inclination of the final pattern, the sizes of a plurality of shots used to form the final pattern, predetermined LER, and whether the shots overlap with each other. Since the inclination of the final pattern and the sizes and LER of the plurality of shots have a correlation with each other, the plurality of shots used to form the final pattern may be determined, and each pair of neighboring pass-based shots may be determined. As described above, a distance between two pass-based shots included in each pass-based shot pair may be different for each of a plurality of pass-based shot pairs.

However, the pass-based shots may be determined so that pass-based distances corresponding to the distances between respective neighboring pass-based shots included in the pass-based shot pairs are substantially the same as each other, in operation S223. When the pass-based distances are substantially the same as each other, electron beam exposure for respective one pass-based shots included in the pass-based shot pairs may be performed, and then electron beam exposure for the respective other pass-based shots spaced from the respective one pass-based shots by substantially the same pass-based distances may be performed.

In operation S230, the pass-based shot pairs may be classified into first and second pass-based shot sets. A plurality of non-neighboring shots may be included in the first and second pass-based shot sets. For example, respective one pass-based shots of the pass-based shot pairs may be included in the first pass-based shot set, and the respective other pass-based shots of the pass-based shot pairs may be included in the second pass-based shot set.

In operation S235, the first pass-based shot set and the pass-based distances may be stored. The first pass-based shot set and the pass-based distances may be stored in the storage unit 840 of FIG. 8. In some embodiments according to the inventive concept, within the pass-based pattern obtained by the division of the final pattern in the inclination direction of the final pattern, the first pass-based shot set and the pass-based distances may be stored to replace the second pass-based shot set since the second pass-based shot set is substantially the same as a result obtained by moving the first pass-based shot set by the pass-based distance in the inclination direction of the final pattern.

In operation S240, a first pass exposure of radiating an electron beam to a reticle for the first pass shot set may be performed. In operation S270, a second pass exposure may be performed based on the stored first pass-based shot set and the stored pass-based distances after the first pass exposure is performed.

Figure 12:
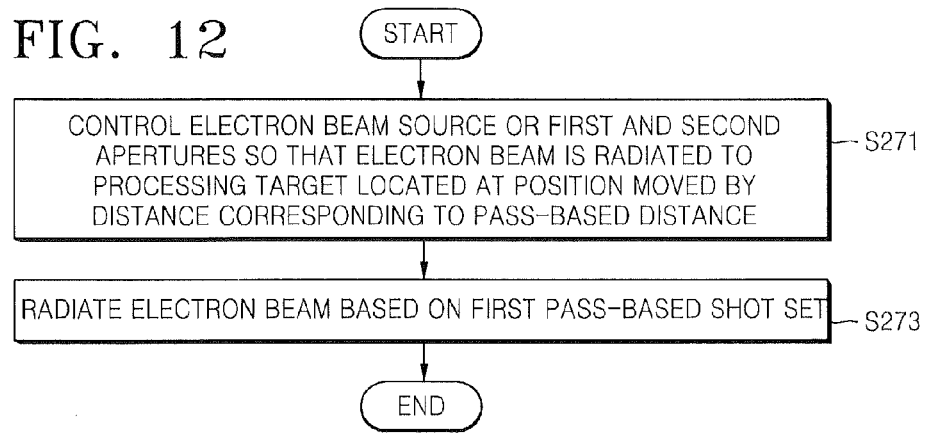
FIG. 12 is a flowchart illustrating second pass exposure operations included in the semiconductor device manufacturing method of FIG. 11.

FIG. 12 is a flowchart of the second pass exposure operation 270 of FIG. 11.

In some embodiments according to the inventive concept, the second pass shot sets may be substantially the same as a result obtained by moving the first pass-based shot set by the pass-based distance. Accordingly, the electron beam source 710 and the first and second apertures 720 and 730 included in the electron beam apparatus 700 may be controlled so that the electron beam EB is radiated to the processing target 740 located at a position moved by a distance corresponding to the pass-based distance in the inclination direction of the final pattern. In some embodiments according to the inventive concept, the platform 750 may be moved by the pass-based distance without controlling the electron beam source 710 and the first and second apertures 720 and 730.

Thereafter, in operation S273, the electron beam EB may be radiated based on the first pass-based shot set. Accordingly, the electron beam EB is radiated based on the first pass-based shot set after the locations on the processing target 740 to which shots are applied are changed by the pass-based distance, and thus a space for storing information about the second pass-based shot set may be saved. Also, pass exposure may be performed by displacing the first pass-based shot set, thereby allowing an improvement in the accuracy of the final pattern.

Figure 13A:
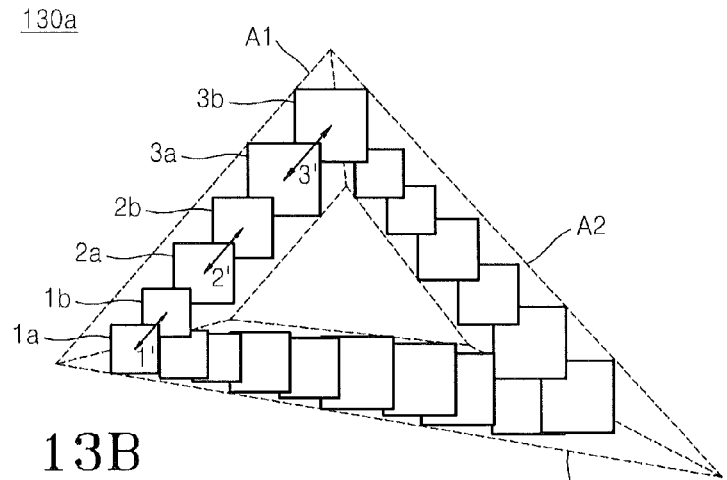
FIGS. 13A and 13B are diagrams for explaining the semiconductor device manufacturing methods illustrated in FIGS. 10 through 12.
Figure 13B:
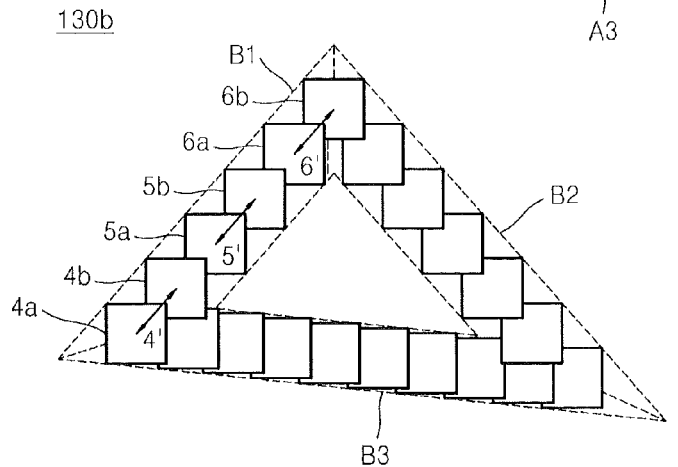

FIGS. 13A and 13B are diagrams for explaining the semiconductor device manufacturing methods illustrated in FIGS. 10 through 12.

FIG. 13A represents a case where a plurality of shots are determined for a final pattern 130*a* having different inclinations so as to have different pass-based distances between shots. FIG. 13B represents a case where a plurality of shots are determined for a final pattern 130*b* having different inclinations so as to have the same pass-based distance between shots.

Referring to FIG. 13A, the final pattern 130*a* may be organized into first, second, and third pass-based patterns A1, A2, and A3 having different inclinations.

The first pass-based pattern A1 may include 6 shots, and the 6 shots may include first, second, and third pairs of pass-based shots 1*a*, 1*b*, 2*a*, 2*b*, 3*a*, and 3*b*. A first pass-based shot set may include first, second, and third one pass shots 1*a*, 2*a*, and 3*a*, and a second pass-based shot set may include first, second, and third other pass shots 1*b*, 2*b*, and 3*b*.

The first one pass shot 1*a* and the first other pass shot 1*b* are spaced apart by a first distance 1', the second one pass shot 2*a* and the second other pass shot 2*b* are spaced apart by a second distance 2', and the third one pass shot 3*a* and the third other pass shot 3*b* are spaced apart by a third distance 3'. The distances between shots of the pass-based shot pairs may be determined to be different.

In this case, in the first pass exposure, an electron beam is radiated for the first, second, and third one pass shots 1*a*, 2*a*, and 3*a*, namely, the first pass shot set, and in the second pass exposure, an electron beam is radiated for the first, second, and third other pass shots 1*b*, 2*b*, and 3*b*, namely, the second pass shot set. Data for the first pass shot set and data for the second pass shot set may be stored separately.

Referring to FIG. 13B, the final pattern 130*b* may be organized into first, second, and third pass-based patterns B1, B2, and B3 having different inclinations, and the pass-based distances between shots of the pass shot pairs included in each of the pass-based patterns B1, B2, and B3 may be substantially the same as each other.

The first pass-based pattern B1 may include 6 shots, and the 6 shots may include fourth, fifth, and sixth pairs of pass-based shots 4*a*, 4*b*, 5*a*, 5*b*, 6*a*, and 6*b*. A first pass-based shot set may include fourth, fifth, and sixth one pass shots 4a, 5a, and 6a, and a second pass-based shot set may include fourth, fifth, and sixth other pass shots 4b, 5b, and 6b.

The fourth pair of pass-based shots 4a and 4b are spaced apart by a fourth distance 4', the fifth pair of pass-based shots 5a and 5b are spaced apart by a fifth distance 5', and the sixth pair of pass-based shots 6a and 6b are spaced apart by a sixth distance 6'. However, in FIG. 13B, the fourth, fifth, and sixth distances 4', 5', and 6' may be substantially the same as each other, and may be represented as a first pass-based distance PD1.

Accordingly, after an electron beam is radiated for the first pass shot set in the first pass exposure with respect to the first pass-based pattern B1, the platform 750, the electron beam source 710, and the first and second apertures 720 and 730 may be moved by the first pass-based distance PD1, and then an electron beam may be radiated based on data about the first pass-based shot set. Consequently, the same effect as that when an electron beam is radiated for the second pass-based shot set may be obtained.

For example, the first pass-based pattern B1 may be moved in the inclination direction of the first pass-based pattern B1 (i.e. the two o'clock direction), the second pass-based pattern B2 may be moved in the inclination direction of the second pass-based pattern B2 (i.e. the ten o'clock direction), and the third pass-based pattern B3 may be moved in the inclination direction of the third pass-based pattern B3 (i.e. the four o'clock direction). The distances of at least one pass-based shot pairs included in one pass-based pattern may be the same as each other, but the distances of different pass-based patterns may be different from or the same as each other.

FIG. 14 is a flowchart of a semiconductor device manufacturing method according to some embodiments of the inventive concept.

Referring to FIG. 14, a final pattern may be organized into one or more scanning-based patterns, in operation S310. In some embodiments according to the inventive concept, the final pattern may be organized randomly or based on a predetermined scanning direction or the like of the semiconductor device manufacturing apparatus 800 for forming the final pattern.

After the formation of each scanning-based pattern is concluded, the formation of the next scanning-based pattern may be performed.

In operation S320, a first scanning-based shot set including a plurality of shots may be determined for each scanning-based pattern. The first scanning-based shot set may include a plurality of shots to form the scanning-based pattern. However, since the first scanning-based shot set initially exposed to an electron beam for the scanning-based pattern may be displaced and then next pass exposure may be performed, the first scanning-based shot set may be formed with LER higher than the desired LER. For example, the first scanning-based shot set may include shots having sizes too large to satisfy the desired LER for the final pattern.

In operation S330, a first scanning-based pass exposure of radiating an electron beam to a reticle may be performed based on the first scanning-based shot set. The shape of the scanning-based pattern after the first scanning-based pass exposure is performed may have accuracy that is less than that of the final pattern.

In operation S340, a second scanning-based shot set for reducing LER may be determined by moving the first scanning-based shot set by a pass-based moving distance. When the second scanning-based shot set is compared with the first scanning-based shot set in terms of a plurality of shots included, the sizes and beam dosages of the shots of the second scanning-based shot set may be substantially the same as those of the first scanning-based shot set, but the shots included in the second scanning-based shot set may be shots obtained by moving a distance between the shots of the first scanning-based shot set and the origin point of a processing target on which the final pattern is formed by the pass-based moving distance. However, in some embodiments according to the inventive concept, the sizes and beam dosages of the shots of the second scanning-based shot set may be different from those of the first scanning-based shot set.

In order to reduce LER by performing the second pass exposure based on the second scanning-based shot set, the second scanning-based shot set may be determined so that an average value of first LER calculated from the first scanning-based shot set corresponds to the pass-based moving distance. However, a plurality of pass exposure processes may be performed until a pass-based pattern is formed for the first LER, and LER may be reduced by sequentially determining the second scanning-based shot set to be results obtained by organizing the first LERs by the number of pass exposure processes performed.

In operation S350, a second scanning-based pass exposure of radiating an electron beam to the reticle may be performed based on the second scanning-based shot set. As described above, the second scanning-based pass exposure may be performed a plurality of number of times so that the pass-based moving distance is changed differently for each second scanning-based pass exposure. The LER of the final pattern may be reduced as the second scanning-based pass exposures are sequentially performed.

In operation S360, after the pass-based pattern included in the final pattern is formed, a circuit may be printed on a wafer according to the reticle. The target on which the circuit is printed based on the reticle is not limited to a wafer. When a circuit is printed based on the reticle formed using the semiconductor device manufacturing method according to the embodiment of FIG. 14, the accuracy of the circuit may be improved.

Figure 15:
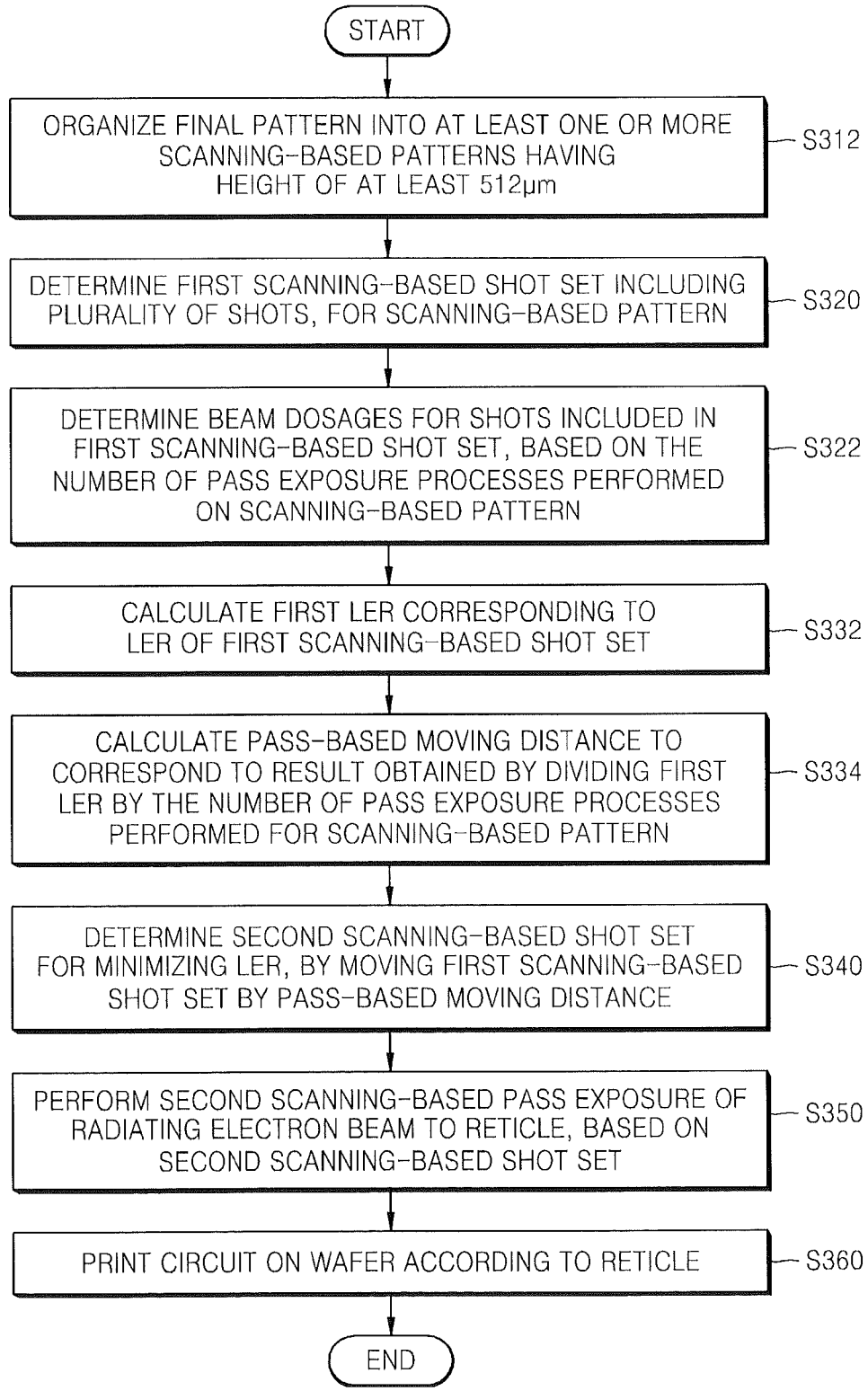

FIG. 15 is a flowchart of a semiconductor device manufacturing method according to some embodiments of the inventive concept.

Referring to FIG. 15, a final pattern may be organized into one or more scanning-based patterns having a height of at least 512 μm, in operation S312. Although the height of the scanning-based pattern may be determined according to the characteristics of the electron beam apparatus 700, the scanning-based pattern having a strip shape with the 512 μm height may be scanned with an electron beam in the x-axis direction.

In operation S320, a first scanning-based shot set including a plurality of shots may be determined for the scanning-based pattern.

In operation S322, beam dosages for the shots included in the first scanning-based shot set may be determined based on the number of pass exposure processes performed on the scanning-based pattern. If a plurality of pass exposure processes are performed on the scanning-based pattern, the beam dosages for the shots may be determined so that a beam dosage required to form the scanning-based pattern is distributed by the number of pass exposure processes performed. Accordingly, a first scanning-based shot set having a distributed beam dosage for the scanning-based pattern may be determined, so that excessive beam dosage may not be needed and, therefore, damage to the reticle due to excessive beam dosage may be prevented.

In operation S332, first LER corresponding to LER of the first scanning-based shot set may be calculated. The first LER may be calculated as an error between neighboring shots included in the first scanning-based shot set, as described, for example, with reference to FIGS. 16A and 16B.

In operation S334, a pass-based moving distance may be calculated to correspond to a result obtained by dividing the first LER by the number of pass exposure processes performed for the scanning-based pattern. The numbers of pass exposure processes performed for the scanning-based patterns may be different. After the same number of pass exposures as a predetermined number of pass exposures are performed for the final pattern, the next scanning-based pattern is formed. Accordingly, the same number of pass exposures as the number of pass exposures performed on the scanning-based pattern may be performed while the first scanning-based shot set is being moved for each exposure.

In operation S340, a second scanning-based shot set for minimizing LER may be determined by moving the first scanning-based shot set by the pass-based moving distance.

In operation S350, a second scanning-based pass exposure of radiating an electron beam to a reticle may be performed based on the second scanning-based shot set. In some embodiments according to the inventive concept, after the second scanning-based pass exposure is performed, the same number of pass exposures as the number of pass exposures performed on the scanning-based pattern may be sequentially performed. After the same number of pass exposures as the predetermined number of pass exposures performed on the scanning-based pattern are performed, the formation of the scanning-based pattern may be concluded.

In operation S360, after the formation of the scanning-based pattern included in the final pattern is completed, a circuit may be printed on a wafer according to the reticle.

Figure 16A:
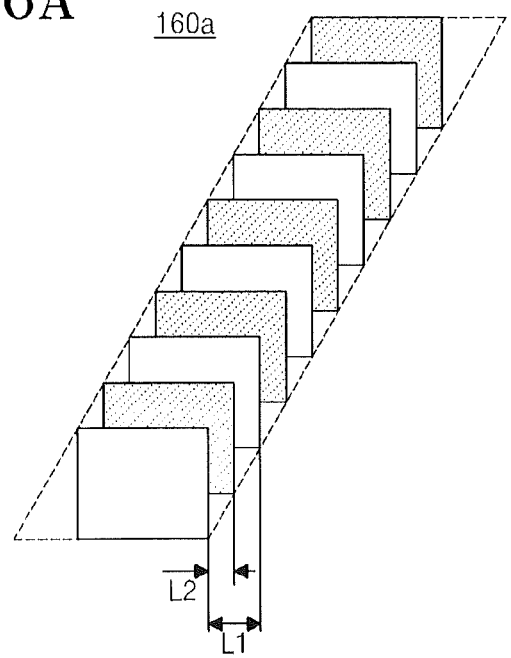
FIGS. 16A and 16B are diagrams illustrating movement of a scanning-based shot set according to pass exposure with respect to a scanning-based pattern in some embodiments according to the inventive concept.
Figure 16B:
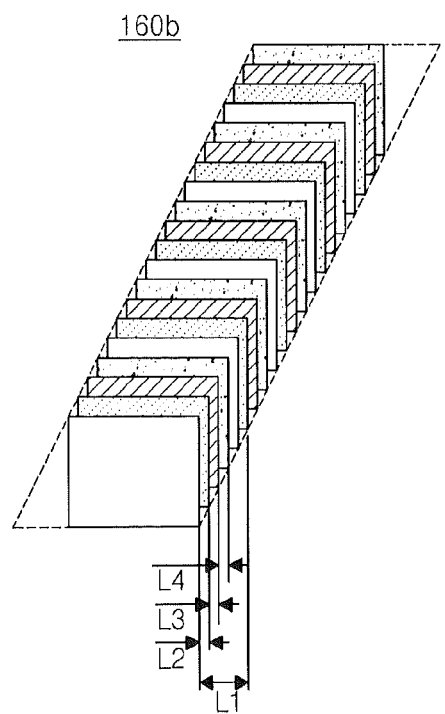

FIGS. 16A and 16B are diagrams for explaining movements of a scanning-based shot set according to pass exposure with respect to a scanning-based pattern.

FIG. 16A illustrates a case where pass exposure is performed on the scanning-based pattern twice. FIG. 16B illustrates a case where pass exposure is performed on the scanning-based pattern four times.

Referring to FIG. 16A, first LER L1 may be calculated after first pass-based exposure is performed for a first scanning-based shot set. Second LER L2 may be set by dividing the first LER L1 by 2, which is the number of pass exposures performed, and a second scanning-based shot set may be determined by setting the second LER L2 to correspond to a pass-based moving distance. The shots of the first scanning-based shot set have substantially the same size and beam dosage as those of the shots of the second scanning-based shot set, but the shots of the first scanning-based shot set have a pass-based moving distance different from that of the shots of the second scanning-based shot set.

Referring to FIG. 16B, first LER L1 may be calculated after first pass-based exposure is performed for a first scanning-based shot set. Second LER L2 may be set by dividing the first LER L1 by 4, which is the number of pass exposures performed, and a second scanning-based shot set may be determined by setting the second LER L2 to correspond to a pass-based moving distance.

After the second pass exposure is performed based on the second scanning-based shot set, the second scanning-based shot set may be moved by the pass-based moving distance to update the second scanning-based shot set. Consequently, the updated second scanning-based shot set may be spaced apart from the first scanning-based shot set by third LER L3.

After pass exposure is performed based on the updated second scanning-based shot set, the second scanning-based shot set may be moved again by the pass-based moving distance to update the second scanning-based shot set, and then fourth pass exposure may be performed. The second scanning-based shot set used in the fourth pass exposure may be spaced apart from the first scanning-based shot set by fourth LER L4.

When compared with the case of FIG. 16A, in the case of FIG. 16B where pass exposure is performed on the scanning-based pattern four times, final LER may be reduced. However, the time required to form a pattern during a plurality of number of times pass exposure is performed may increase.

The semiconductor device manufacturing method according to some embodiments of the inventive concept may be performed by determining shot sets having different positions according to a final pattern and displacing a shot. However, in some embodiments according to the inventive concept, the final pattern may be generated and provided to displace a shot. If a final pattern in which the displacement of a pass is reflected is provided, the semiconductor device manufacturing method according to some embodiments of the inventive concept may be performed for each final pattern.

By locating a final pattern so that the position of a pass is changed, a shot set may be determined based on first and second final patterns according to the conventional art an pass exposure may be performed, without performing an operation of dividing a plurality of shots into first and second pass shot sets based on a single final pattern.

Therefore, data may be generated by, for example, the displacement of the position of the final pattern and the determination of a shot set in the first operation of the semiconductor device manufacturing method according to some embodiments of the inventive concept.

In a semiconductor device manufacturing method according to an embodiment of the inventive concept, a final pattern may be formed more accurately by changing the position of a shot according to each pass instead of performing pass exposure a plurality of number of times based on identical shot data, and heating of a reticle may be reduced by distributing a beam dosage used to form the final pattern over a number of times that the exposures are performed.

Moreover, in the semiconductor device manufacturing method according to an embodiment of the inventive concept, a final pattern is organized based on the inclination thereof, a shot set and a pass-based moving distance for a result of the division are stored, and pass exposure is performed, so that the size of data required to form the pattern may be reduced.

While the inventive concept has been particularly shown and described with reference to exemplary embodiments thereof, it will be understood that various changes in form and details may be made therein without departing from the spirit and scope of the following claims.

What is claimed:

1. A method of manufacturing semiconductor devices, the method comprising:
    determining a shot set including a plurality of shots, based on a final pattern used to form a mask;
    classifying shots in the plurality shots as being included in a first pass shot set or a second pass shot set each including a plurality of non-directly neighboring shots;
    performing first pass exposure to radiate a reticle to provide the first pass shot set; and
    performing second pass exposure to radiate the reticle to provide the second pass shot set.

2. The method of claim 1, wherein determining the shot set comprises:
    determining whether any of the plurality of shots overlap one another to provide overlapping shots; and determining at least one selected from the group consisting of size and beam dosage of the overlapping shots.

3. The method of claim 1, wherein determining the shot set comprises:
   determining pairs of pass shots that are direct neighbors of each other and have substantially equal sizes and substantially equal beam dosages.

4. The method of claim 3, wherein classifying comprises:
   classifying respective one pass shots included in the pairs of pass shots into the first pass shot set and the respective other pass shots included in the pairs of pass shots into the second pass shot set.

5. The method of claim 1, wherein determining the shot set comprises generating a first auxiliary final pattern and a second auxiliary final pattern from the final pattern,
   wherein shots in the first pass shot set are determined based on the first auxiliary final pattern,
   wherein shots in the second pass shot set are determined based on the second auxiliary final pattern.

6. The method of claim 1, further comprising organizing the final pattern into at least one scanning-based pattern,
   wherein the shot set is determined based on the scanning-based pattern.

7. The method of claim 1, wherein the plurality of shots are shots of a variable shaped beam (VSB) that has at least one shape selected from the group consisting of rectangular, triangular, and circular.

8. The method of claim 1, wherein before performing the first pass exposure and performing the second pass exposure, further comprising:
   correcting the first pass shot set and the second pass shot set by at least one selected from the group consisting of proximity effect correction (PEC), optical proximity correction (OPC), and blur correction.

9. A method of manufacturing semiconductor devices, the method comprising:
   organizing a final pattern used to form a mask, into at least one pass-based pattern, based on an inclination of the final pattern;
   determining pairs of pass-based shots that are direct neighbors to each other and have substantially equal sizes and substantially equal beam dosages to provide pass-based shot pairs for the pass-based pattern;
   classifying the pass-based shot pairs into a first pass shot set or a second pass shot set;
   performing first pass exposure of radiating an electron beam to a reticle for the first pass shot set; and
   performing second pass exposure of radiating the electron beam to the reticle for the second pass shot set.

10. The method of claim 9, wherein the first and second pass exposures perform on the pass-based pattern.

11. The method of claim 9, wherein determining the pass-based shot pairs comprises:
    determining the pass-based shot pairs, based on the inclination of the final pattern, the sizes of the plurality of shots, predetermined line edge roughness (LER), and whether the plurality of shots overlap with each other.

12. The method of claim 9, wherein determining of pass-based shot pairs comprises:
    determining the first and second pass-based shots so that pass-based distances corresponding to the distances between respective directly neighboring pass-based shots included in the pass-based shot pairs are substantially equal to each other.

13. The method of claim 12, further comprising storing the first pass shot set and the pass-based distances.

14. The method of claim 13, wherein performing the second pass exposure comprises:
    controlling a source for radiating the electron beam or an aperture for shaping the electron beam, so as to correspond to the pass-based distances; and
    radiating the electron beam to the reticle, based on the first pass shot set.

15. The method of claim 12, wherein performing the second pass exposure comprises:
    moving the reticle by the pass-based distances and radiating the electron beam to the reticle based on the first pass shot set.

16. The method of claim 12, wherein the pass-based distances have different values for the pass-based pattern.

17. A method of forming a pattern in a semiconductor device comprising:
    determining a shot set including a plurality of shots each having a respective size and beam dosages associated therewith for formation a mask; and
    determining the respective size and beam dosages to be used for each of the plurality of shots based on the determined shot set to provide a final pattern, wherein determining the respective size and beam dosages comprises setting the respective size of each of the plurality of shots to be equal to one another and setting the respective beam dosages of the plurality of shots to be equal to one another, the method further comprising:
    organizing ones of the plurality of shots into either a first pass of shots or a second pass of shots based on the respective sizes and respective beam dosages.

18. The method of claim 17 wherein organizing comprises organizing the ones of the plurality of shots based on an inclination of the final pattern.

19. The method of claim 18 wherein organizing comprises organizing the ones of the plurality of shots so that distances that separate directly neighboring shots are equal.

20. The method of claim 17 further comprising:
    performing a first pass exposure to a reticle using the first pass of shots;
    waiting a time interval configured to reduce heat damage to the reticle; and
    performing a second pass exposure to the reticle using the second pass of shots after expiration of the time interval.

* * * * *